US012727495B2

(12) United States Patent
Sailer et al.

(10) Patent No.: US 12,727,495 B2
(45) Date of Patent: Sep. 1, 2026

(54) ELECTRICAL PACKAGES WITH ELONGATED INTERCONNECT MEMBERS

(71) Applicant: Skyworks Solutions, Inc., Irvine, CA (US)

(72) Inventors: Jeffrey Sailer, Cedar Rapids, IA (US); Howard E. Chen, Anaheim, CA (US); Yi Liu, San Diego, CA (US)

(73) Assignee: Skyworks Solutions, Inc., Irvine, CA (US)

(*) Notice: Subject to any disclaimer, the term of this patent is extended or adjusted under 35 U.S.C. 154(b) by 632 days.

(21) Appl. No.: 18/068,343

(22) Filed: Dec. 19, 2022

(65) Prior Publication Data

US 2023/0215796 A1 Jul. 6, 2023

Related U.S. Application Data

(60) Provisional application No. 63/305,985, filed on Feb. 2, 2022, provisional application No. 63/296,425, filed (Continued)

(51) Int. Cl.

| | |
|---|---|
| ***H10W 70/65*** | (2026.01) |
| ***H10W 74/10*** | (2026.01) |
| ***H10W 90/00*** | (2026.01) |

(52) U.S. Cl.

CPC .......... *H10W 70/65* (2026.01); *H10W 74/114* (2026.01); *H10W 74/131* (2026.01); *H10W 90/00* (2026.01); *H10W 90/701* (2026.01)

(58) Field of Classification Search

CPC ........... H01L 23/49838; H01L 23/3121; H01L 23/3157; H01L 23/49811; H01L 23/49816;

(Continued)

(56) References Cited

U.S. PATENT DOCUMENTS

| | | | |
|---|---|---|---|
| 6,377,464 | B1 | 4/2002 | Hashemi et al. |
| 6,867,499 | B1 | 3/2005 | Tabrizi et al. |

(Continued)

FOREIGN PATENT DOCUMENTS

| | | |
|---|---|---|
| JP | 2000-243862 A | 9/2000 |
| JP | 2006-294656 | 10/2006 |
| WO | WO 2023/158970 | 8/2023 |

OTHER PUBLICATIONS

International Search Report for PCT/US2023/062435 dated Jun. 5, 2023 (3 pages).

(Continued)

*Primary Examiner* — Omar F Mojaddedi
(74) *Attorney, Agent, or Firm* — Knobbe, Martens, Olson & Bear, LLP

(57) ABSTRACT

An electrical package can include a substrate having a first side and a second side opposite the first side. One or more electrical components mounted to the substrate, and a plurality of electrically conductive interconnect members can be coupled to the second side of the substrate. At least one of the interconnect members can have an elongated shape with a length that is longer than a width. The interconnect member with the elongated shape positioned can be at or proximate one of the corners. The interconnect members can be arranged as a grid, with first interconnect members each occupying a single grid cell, and second interconnect members each occupying at least two grid cells. The second interconnect members can have a shape of two of the first interconnect members coupled by a bridge portion.

24 Claims, 11 Drawing Sheets

Related U.S. Application Data on Jan. 4, 2022, provisional application No. 63/296,424, filed on Jan. 4, 2022.

(58) Field of Classification Search

CPC ... H01L 25/105; H01L 25/0652; H01L 25/16; H05K 1/0243; H05K 1/141; H05K 3/284; H10W 70/65; H10W 74/114; H10W 74/131; H10W 90/00; H10W 90/701; H10W 90/22; H10W 90/291; H10W 90/724

See application file for complete search history.

(56) References Cited

U.S. PATENT DOCUMENTS 7,192,810 B2 3/2007 Tabrizi et al.
7,824,965 B2 11/2010 Fryklund et al.
7,902,666 B1 * 3/2011 Hsu .................. H10W 70/65 257/737
8,022,557 B2 9/2011 Fryklund et al.
8,105,879 B2 1/2012 Fryklund et al.
8,222,085 B2 7/2012 Fryklund et al.
9,263,409 B2 * 2/2016 DeLaCruz ......... G01R 31/2884
9,660,609 B2 5/2017 Reisner et al.
9,692,120 B2 6/2017 Chen et al.
10,192,785 B2 1/2019 Liu et al.
10,361,145 B2 7/2019 Chen et al.
10,396,753 B2 8/2019 Reisner et al.
10,410,885 B2 9/2019 Darveaux et al.
10,460,957 B2 10/2019 Darveaux et al.
10,497,656 B2 12/2019 Chen et al.
10,593,565 B2 3/2020 Darveaux et al.
10,607,944 B2 3/2020 Chen et al.
10,770,312 B2 9/2020 Darveaux et al.
11,127,690 B2 9/2021 Chen et al.
11,139,257 B2 10/2021 Chen et al.
11,201,066 B2 12/2021 Darveaux et al.
11,233,014 B2 1/2022 Chen et al.
11,244,835 B2 2/2022 Darveaux et al.
11,552,039 B2 * 1/2023 Wang .................. H10W 46/00
11,682,585 B2 6/2023 Liu et al.
11,894,323 B2 2/2024 Chen et al.
11,961,805 B2 4/2024 Chen et al.
12,033,954 B2 7/2024 Chen et al.
2002/0104874 A1 * 8/2002 Byun ................ H01L 23/49816 228/248.1
2009/0127695 A1 5/2009 Kim et al.
2014/0038355 A1 2/2014 Brugiere et al.
2016/0099192 A1 4/2016 Chen et al.
2018/0063966 A1 * 3/2018 Chiu .................. H01L 23/373
2018/0076148 A1 3/2018 Nguyen et al.
2018/0096950 A1 4/2018 Chen et al.
2018/0096951 A1 4/2018 Chen et al.
2018/0226271 A1 8/2018 Chen et al.
2018/0226361 A1 8/2018 Chen et al.
2020/0091075 A1 3/2020 Yu et al.
2020/0111731 A1 * 4/2020 Ishikawa ............... H10W 70/65
2020/0152483 A1 5/2020 Darveaux et al.
2020/0161222 A1 5/2020 Chen et al.
2020/0321272 A1 10/2020 Agarwal et al.
2022/0130686 A1 4/2022 Darveaux et al.
2023/0215795 A1 7/2023 Sailer et al.
2023/0260880 A1 8/2023 Chen et al.
2023/0326841 A1 10/2023 Darveaux et al.
2023/0369239 A1 11/2023 Chen et al.
2023/0389190 A1 11/2023 Walling et al.

OTHER PUBLICATIONS

Written Opinion for PCT/US2023/062435 dated Jun. 5, 2023 (4 pages).
International Search Report for PCT/US2022/081967 dated May 4, 2023 (4 pages).
Written Opinion for PCT/US2022/081967 dated May 4, 2023 (4 pages).
International Preliminary Report on Patentability and Written Opininon for PCT/US2023/062435 dated Aug. 20, 2024 (5 pages).

* cited by examiner

ELECTRICAL PACKAGES WITH ELONGATED INTERCONNECT MEMBERS

CROSS REFERENCE TO RELATED APPLICATIONS

This application claims the benefit of priority U.S. Provisional Patent Application No. 63/296,424, filed Jan. 4, 2022 and titled "PACKAGES WITH ELONGATED INTERCONNECT MEMBERS," U.S. Provisional Patent Application No. 63/296,425, filed Jan. 4, 2022 and titled "PACKAGES WITH REINFORCED INTERCONNECT MEMBERS," and U.S. Provisional Patent Application No. 63/305,985, filed Feb. 2, 2022 and titled "MECHANICALLY REINFORCED ELECTRICAL PACKAGES," the contents of each of which are hereby incorporated by reference in their entirety.

BACKGROUND

Technical Field

Embodiments of this disclosure relate to packaging of circuit devices, such as radio frequency modules that can be mounted on a circuit board, and more particularly to packaging of circuit devices with interconnect members of different shapes or sizes.

Description of Related Technology

Circuit devices, such as radio frequency modules, can be implemented in a packaged module. Such devices can be connected to a mother board (e.g., of an electronic device) via solder joints (e.g., solder balls). Mechanical shock tests (e.g., drop tests) are often performed to test the connection between the mother board and the circuit devices (e.g., the connection provided by the solder joints). As the size of the pads of circuit boards (e.g., mother boards) in electronic devices decrease (e.g., to decrease the size of the electronic device), which require a corresponding decrease in size of the connections in packages mounted to the circuit board, stresses during testing can result in increased failure rate of packages.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

Various embodiments disclosed herein can relate to an electrical package, which can include a substrate having a first side and a second side opposite the first side, one or more electrical components mounted to the substrate, and a plurality of electrically conductive interconnect members coupled to the second side of the substrate. At least one of the interconnect members can have an elongated shape with a length that is longer than a width.

The one or more electrical components can be mounted to the first side of the substrate. One or more additional electrical components can be mounted to the second side of the substrate. The electrical package can include a mold structure extending over at least part of the second side of the substrate and/or at least partially surrounding the one or more additional electrical components. The electrical package can include a mold structure extending over at least part of the first side of the substrate and/or at least partially surrounding the one or more electrical components. The substrate can have a generally rectangular shape in plan view with four corners. The interconnect member with the elongated shape positioned can be at or proximate one of the corners. Others of the interconnect members can have a generally circular shape in plan view and can be disposed inward from the one of the corners. The substrate can have a corner, and the closest interconnect member to the corner can have the elongated shape. A plurality of the interconnect members can have a generally circular shape in plan view with a substantially uniform diameter. The at least one of the interconnect members with the elongated shape can have a width that is substantially equal to the diameter of the circular interconnect members and a length that is at least two times the diameter of the circular interconnect members. The interconnect member with the elongated shape can be a furthest interconnection member from a center of the package. The at least one interconnect member with the elongated shape can have a length L that is substantially equal to $n \cdot W+(n-1) \cdot G$, where n is a positive integer, W is a width of the interconnect member, and G is a distance between adjacent interconnect members. The interconnect members can be arranged as a grid, with a group of the interconnect members each occupying a single grid cell, and the interconnect member with the elongated shape occupying at least two grid cells arranged linearly. The package can be a dual-sided molded package.

Various embodiments disclosed herein can relate to an electrical package, which can include a substrate having a first side and a second side opposite the first side, one or more electrical components mounted to the substrate, a plurality of first electrically conductive interconnect members coupled to the second side of the substrate and having substantially uniform widths, and at least one second electrically conductive interconnect member having a width that is substantially the same as the substantially uniform widths of the first interconnect members and a length that is greater than or equal to a combined length of two of the first interconnect members.

The one or more electrical components can be mounted to the first side of the substrate. One or more additional electrical components can be mounted to the second side of the substrate. The electrical package can include a mold structure extending over at least part of the second side of the substrate and/or at least partially surrounding the one or more additional electrical components. The electrical package can include a mold structure extending over at least part of the first side of the substrate and/or at least partially surrounding the one or more electrical components. The substrate can have a generally rectangular shape in plan view with four corners. The at least one second interconnect member can be positioned at or proximate to at least one of the corners. The first interconnect members can have a generally circular shape in plan view. At least one of the second interconnect members can be a furthest interconnection member from a center of the package. The at least one interconnect member with the elongated shape can have a length L that is substantially equal to $n \cdot W+(n-1) \cdot G$, where n is a positive integer, W is the width of the first interconnect members, and G is a distance between adjacent first interconnect members. The interconnect members can be arranged as a grid, with the first interconnect members each occupying a single grid cell, and the second interconnect member each occupying at least two grid cells. The second interconnect member can have a shape of two of the first interconnect members coupled by a bridge portion. The second interconnect member can have a generally capsular shape. The package can be a dual-sided molded package.

Various embodiments disclosed herein can relate to an electrical package, which can include a substrate having a first side and a second side opposite the first side, one or more electrical components mounted to the substrate, and a plurality of electrically conductive interconnect members arranged as a two-dimensional array on the second side of the substrate. A plurality of the interconnect members can each occupy one array location. At least one of the interconnect members can occupy at least two array locations.

The one or more electrical components can be mounted to the first side of the substrate. One or more additional electrical components can be mounted to the second side of the substrate. The electrical package can include a mold structure extending over at least part of the second side of the substrate and/or at least partially surrounding the one or more additional electrical components. The electrical package can include a mold structure extending over at least part of the first side of the substrate and/or at least partially surrounding the one or more electrical components. The package can be a dual-sided molded package. The interconnect members that occupy one array location can have a generally circular shape. The substrate can have a generally rectangular shape in plan view with four corners. The at least one interconnect member that occupies at least two array locations can be positioned at or proximate to at least one of the corners. The at least one interconnect member that occupies at least two array locations can be a furthest interconnection member from a center of the package. The at least one interconnect member that occupies at least two array locations can have a length L that is substantially equal to $n \cdot W+(n-1) \cdot G$, where n is a positive integer, W is the width of the interconnect members, and G is a distance between adjacent interconnect members. The second interconnect member can have a generally capsular shape.

Various embodiments disclosed herein can relate to an electrical package, which can include a substrate having a first side, a second side opposite the first side, and at least one corner. One or more electrical components can be mounted to the substrate. A plurality of electrically conductive interconnect members can be coupled to the second side of the substrate. At least one of the interconnect members can be closest to the corner and can have a larger size than inner interconnect members that are positioned further inward away from the corner.

The one or more electrical components can be mounted to the first side of the substrate. One or more additional electrical components can be mounted to the second side of the substrate. The electrical package can include a mold structure extending over at least part of the second side of the substrate and/or at least partially surrounding the one or more additional electrical components. The electrical package can include a mold structure extending over at least part of the first side of the substrate and/or at least partially surrounding the one or more electrical components. At least some of the inner interconnect members can have a generally circular shape. The at least one interconnect member that is closest to the corner can have a generally capsular shape. The interconnect members can be arranged as a grid. At least some of the inner interconnect members can occupy a single grid cell. The interconnect member that is closest to the corner can occupy at least two grid cells.

Various embodiments disclosed herein can relate to an electrical package, which can include a substrate having a first side and a second side opposite the first side, one or more electrical components mounted to the substrate, and a plurality of electrically conductive interconnect members coupled to the second side of the substrate. At least one of the interconnect members that is furthest from a center of the substrate can have a larger size than others of the interconnect members that are positioned closer to the center.

The one or more electrical components can be mounted to the first side of the substrate. One or more additional electrical components can be mounted to the second side of the substrate. The electrical package can include a mold structure extending over at least part of the second side of the substrate and/or at least partially surrounding the one or more additional electrical components. The electrical package can include a mold structure extending over at least part of the first side of the substrate and/or at least partially surrounding the one or more electrical components. At least some of the others of the interconnect members can have a generally circular shape. The at least one interconnect member that is furthest from the center can have a generally capsular shape. The at least one interconnect member that is furthest from the center can be positioned at or proximate to a corner of the package. The interconnect members can be arranged as a grid, with at least some of the other interconnect members each occupying a single grid cell, and the interconnect member that is furthest from the center can occupy at least two grid cells.

BRIEF DESCRIPTION OF THE DRAWINGS

Embodiments of this disclosure will now be described, by way of non-limiting example, with reference to the accompanying drawings.

DETAILED DESCRIPTION

Figure 1:
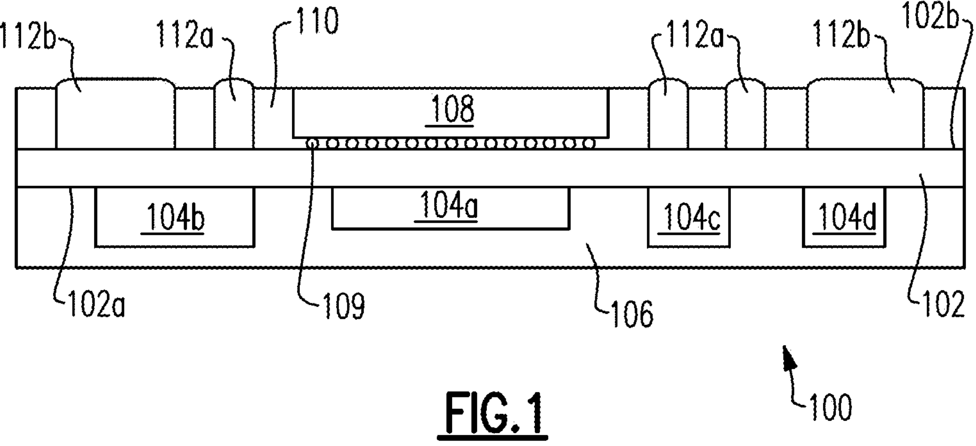
FIG. 1 shows a cross-sectional schematic view of an example of an electrical package.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Aspects and embodiments described herein are directed to an electrical package, preferably a dual-sided electrical package, for coupling to a separate circuit board. The electrical package can be a dual-sided molded electrical package, although other package types can be used in some embodiments. Aspects and embodiments described herein provide an alternative to the use of traditional arrays electrical connections (e.g., solder joints) to facilitate coupling of the electrical package to such a separate circuit board. The package can have electrical connectors of different sizes, with some electrical connectors that are larger than others. For example, larger electrical connectors can be used at or near the corners or edges of the package, which can provide improved mechanical performance when the electrical package is subjected to impact forces (e.g., drops) encountered during validation testing (e.g., mechanical shock testing), transport, or during operational use of the package. In some embodiments, the larger electrical connectors can also provide improved thermal properties (e.g., for dissipating heat). In some embodiments, the larger electrical connectors can withstand more current and can be used for higher power signals. The larger electrical connectors can have an elongated shape, which can correspond to at least two of the smaller electrical connectors interconnected linearly.

FIG. 1 shows a cross-sectional schematic view of an example of an electrical package 100. The electrical package can have a substrate 102 (e.g., a packaging substrate), which can be generally planar in form. The packaging substrate 102 can be a laminate substrate, for example. The substrate 102 can have a first side 102*a* and a second side 102*b*, which can be opposite the first side 102*a*. One or more electrical components 104*a-d* can be mounted on or over the first side 102*a* of the substrate 102. The one or more electrical components 104*a-d* can include one or more dies (e.g., semiconductor dies), integrated circuits, filters, amplifiers (e.g., low noise, power), switches, memory, processors, transceivers, control circuits, other circuit components, or any other suitable electrical elements. The electrical components 104*a-d* can be surface mounted onto the substrate 102, although any suitable mounting technique can be used. In some cases, the electrical components 104*a-d* (e.g., die or integrated circuit 104*a*) can be electrically coupled to pads on the substrate 102 by interconnect members (not shown in FIG. 1). Solder joints (e.g., solder balls) can be used for mounting components to the substrate 102, although wire bonds, or any other suitable connectors can also be used.

A first mold structure or material 106 can extend over at least a portion of the first side 102*a* of the substrate 102. The first mold structure 106 can include (e.g., be formed from) an epoxy material, although any suitable mold material can be used. The first mold structure 106 can fully or partially surround the sides of the one or more electrical components 104*a-d*. The first mold structure 106 can extend partially or fully over the one or more electrical components 104*a-d*. The one or more electrical components 104*a-d* can be fully or partially encapsulated beneath an outer surface of the first mold structure 106. In some implementations, the tops of one or more of the electrical components 104*a-d* can be flush with the outer surface of the first mold structure 106, or can extend beyond the outer surface of the first mold structure 106. The one or more electrical components 104*a-d* can be exposed in some cases, or they can be covered by the first mold structure 106.

At least one electrical component 108 can be mounted on or over the second side 102*b* of the substrate 102. The package 100 can be a dual-sided package. The electrical components 108 can include at least one die or integrated circuit, although one or more filters, amplifiers, switches, memory elements, processors, transceivers, control circuits, or any suitable electrical component(s) 108 can be used. Although FIG. 1 shows a single component 108, multiple components 108 can be mounted to the second side 102*b* of the substrate 102 in some implementations. In some implementations, the package 100 can include circuit components that facilitate transmission and/or reception of radio frequency (RF) signals. The at least one electrical component 108 can include a flip chip, in some embodiments. The electrical component 108 can be coupled to (e.g., electrically connected to pads on) the substrate 102 by interconnect members 109 (e.g., solder balls, solder joints, metallic connection posts, pins). Wire bonds or other suitable electrical connections could be used. The electrical component 108 can be surface mounted onto the substrate 102, although any suitable mounting technique can be used.

A second mold structure or material 110 can extend over at least a portion of the second side 102*b* of the substrate 102. The second mold structure 110 can include (e.g., be formed from) an epoxy material, although any suitable mold material can be used. The second mold structure 110 can fully or partially surround the sides of the at least one electrical component 108. The second mold structure 110 can extend partially or fully over the at least one electrical component 108. The at least one electrical component 108 can be fully or partially encapsulated beneath an outer surface of the second mold structure 110. In some implementations, the top of the at least one electrical component 108 can be flush with the outer surface of the second mold structure 110, or can extend beyond the outer surface of the second mold structure 110. The at least one electrical component 108 can be exposed in some cases, or it can be covered by the second mold structure 110.

Either or both of the mold structures 106 and 110 can be configured to facilitate radio frequency shielding of at least some of the electrical component(s) 104*a-d* and 108. In some cases, additional shielding component(s) or layer(s) can be used. The package 100 can be a shielded package. Either or both of the first and second mold structures 106 and 110 may help to protect the electrical components (104*a-d* and 108) mounted to the substrate 102 from impact loads (e.g., drops) encountered during validation testing, transportation or operational use. Impact loads may be dissipated throughout the first and/or second mold structures 106, 110, thereby helping to reduce the forces encountered by the electrical components 104*a-d*, 108.

In some implementations, either or both of the mold structures 106 and 110 can be omitted. The package can be a dual-sided ball grid array package, although any suitable configuration can be used. In some embodiments, the at least one electrical component 108 on the second side 102*b* of the substrate 102 can be omitted. A single-sided package can be used, in some cases.

The package 100 can include a plurality of interconnection members 112 on or over the second side 102*b* of the substrate 102. The interconnection members 112 can be solder balls, solder joints, metallic connection posts, conductive pins, or any other suitable electrically conductive elements. The interconnection members 112 can be arranged in an array or grid. The interconnection members 112 can be generally ball-shaped, or they can be shaped as generally cylindrical posts, or they can have any other suitable shape. The interconnection members 112 can be made of any suitable electrically conductive material, such as solder, copper, aluminum, silver, gold, etc. The interconnection members 112 can extend through the second mold structure 110. The interconnection members 112 can protrude past the outer surface of the mold structure 110. However, in other embodiments, the interconnection members 112 may be substantially flush with the outer surface of the second mold structure 110. The interconnection members can be electrically connected to pads or other contacts on the substrate 102, which can be coupled to the electrical components 104*a-d*, 108. By way of example, the substrate 102 can be a printed circuit board (PCB), and can have electrical pathways to delivery electrical power and/or signals between the electrical components 104*a-d*, 108 and the interconnection members 112.

The package 100 can include different sizes and shapes of interconnection members 112. In FIG. 1, two types of interconnection members 112*a* and 112*b* are shown. The packager 110 can include first interconnection members 112*a* and second interconnection members 112*b*, which can be larger than the first interconnection members 112*a*. As discussed herein, the larger interconnection members 112*b* can provide improved mechanical reliability, such as during mechanical shock testing (e.g., drop testing) or during use.

Figure 2:
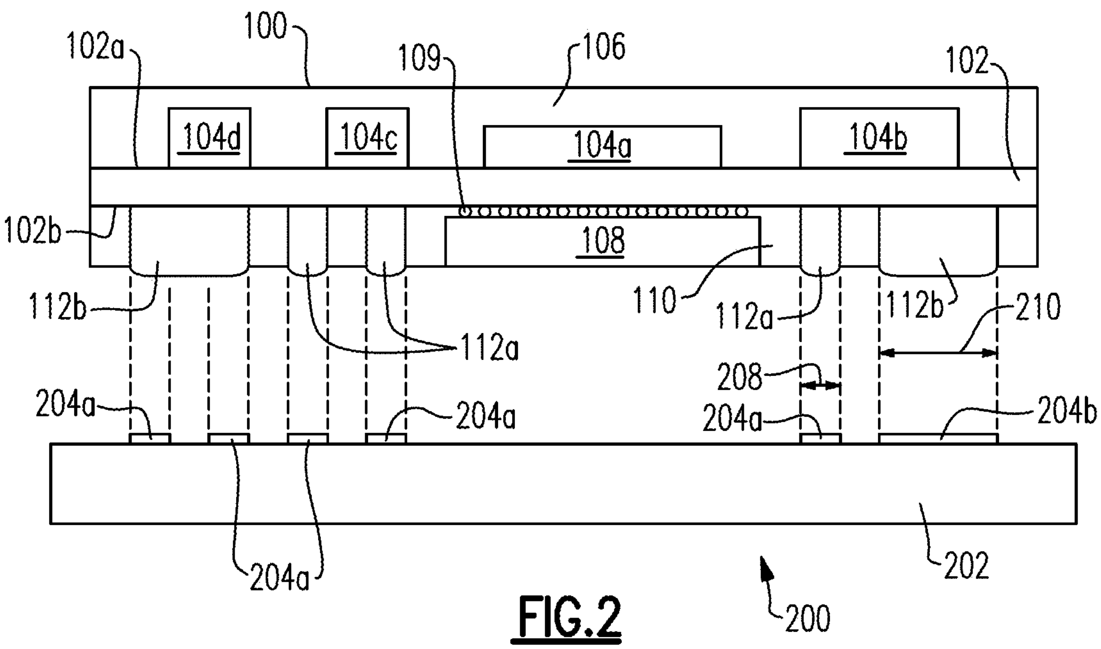
FIG. 2 shows a cross-sectional schematic view of an example of an electrical package and an associated circuit board.

FIG. 2 shows a cross-sectional schematic view of an example system 200 that includes the example package 100 opposite a circuit board 202 (e.g., phone board, mother board) on which the package 100 is mounted. The circuit board 202 may itself form part of an electronic device, such as a wireless device. By way of example, the wireless device may take the form of a mobile phone, a tablet computer, a smart watch, a laptop computer, etc. The circuit board 202 can have one or more pads 204 disposed on (e.g., attached to, formed on) the circuit board 202. The pads 204 can be made of metal or another suitable material that provides electrical and/or thermal conductivity between the interconnect members 112 and the circuit board 202.

The package 100 mounts to the circuit board 202 via a connection between the interconnect members 112 and the pads 204. For example, at least a portion of the interconnect members 112 can be deposited/melted onto the pads 204 (e.g., by applying heat to the interconnect members 112 causing them to reflow). Electrical power and/or signals can be sent between the package 100 (e.g., the electrical components 104*a-d* and 108) and the circuit board 202 (e.g., other electrical components or packages mounted to the circuit board 202) through the pads 204, through the interconnection members 112, and through conductive pathways in the package substrate 102 (e.g., PCB). The package 100 can mount to the circuit board 202 so that the bottom surface of the second mold structure 110 is spaced apart (e.g., by a gap) from the surface of the circuit board 202, which can inhibit (e.g., prevent) damage to the electrical component 108 due to displacement of the package 100 relative to the circuit board 204 (e.g., due to flexing or dropping of the circuit board 202 with the package 100 mounted on it, or dropping of an electronic device, such as a smartphone incorporating the circuit board 204 and package 100).

In some embodiments, the pads 204 can have a substantially uniform size (e.g., width or diameter) 208, which can be substantially equal to (e.g., coincides with) a size (e.g., width or diameter) of the first or smaller interconnect members 112*a* (e.g., at the widest part if ball-shaped). The first or smaller interconnect members 112*a* can align with corresponding pads 204. In some embodiments, the second or larger interconnect members 112*b* can align with, cover, and/or connect to two of the pads 204 (as shown on the left side of FIG. 2). In some embodiments, the circuit board 202 can have first pads 204*a*, which can align with the first interconnect members 112*a*, and second pads 204*b*, which can be larger than the first pads 204*a*, and which can align with the second, larger interconnect members 112*b* (as shown on the right side of FIG. 2). The circuit board 202 can have elongated pads 204*b*, which can substantially match the shape of the elongated interconnect members 112*b*, which are discussed herein. By way of example, the first pads 204*a* can have a generally circular shape and a width or diameter 208, and the second pads 204*b* can have an elongated shape that can substantially match the shape of the second interconnect members 112*b*, as discussed herein. The second pad(s) 204*b* can have substantially the same width 208 as the first pads 204*a*, and a length 210 that is longer than the width 208 of the first pads 204*a*. In some embodiments, all the elongated interconnect members 112*b* can interface with corresponding elongated pads 204*b*. The two pads 204*a* on the left of FIG. 2 can be replaced with an elongated pad 204*b*, which can have substantially the same footprint as the second interconnect member 112*b*.

Figure 3:
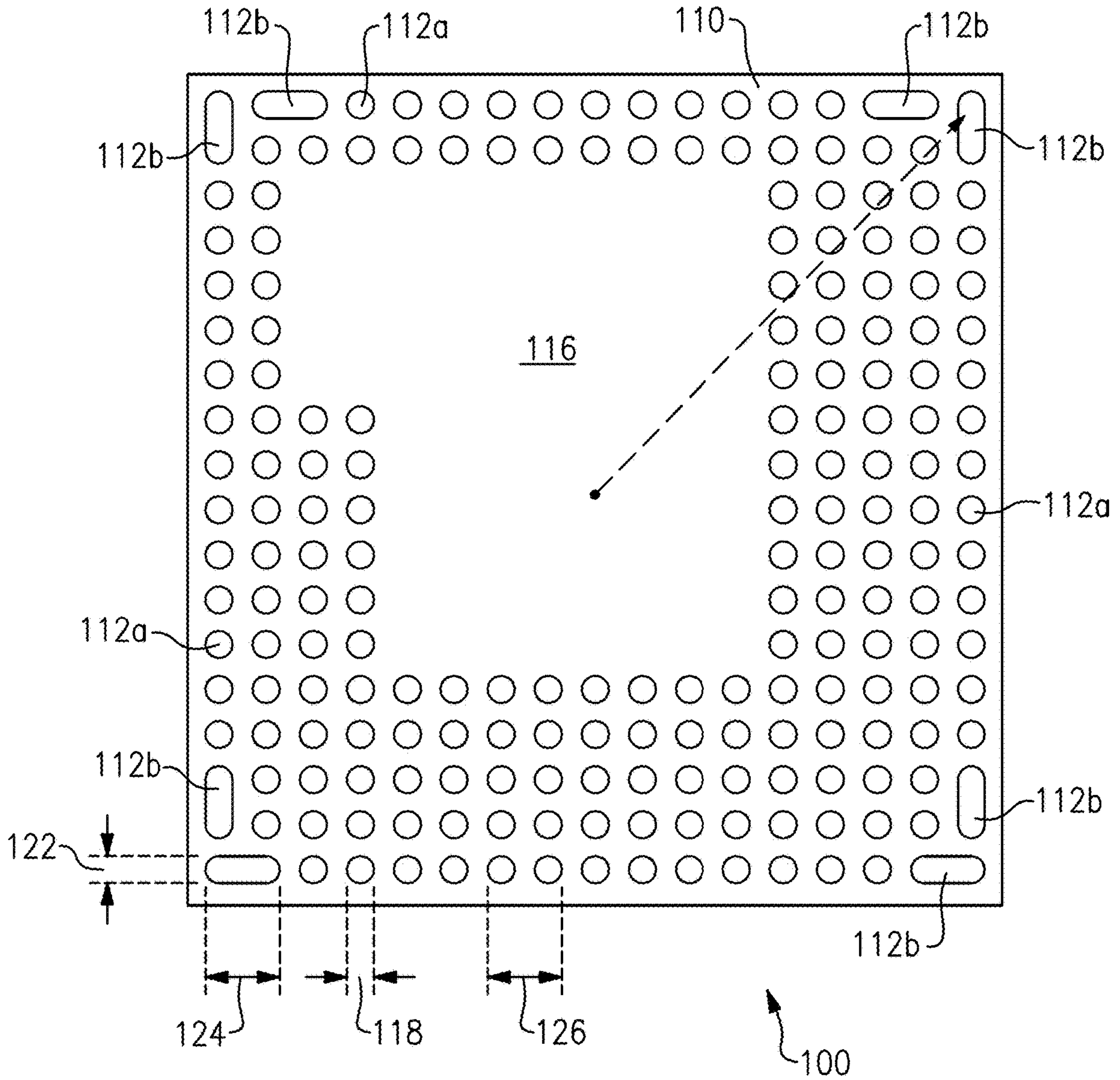
FIG. 3 shows a plan view of a second side of an example of a package.

FIG. 3 shows a bottom view of an example package 100, which can be similar to the package 100 of FIGS. 1 and 2. The package 100 can have a plurality of exposed interconnect members 112. The second mold structure 110 can be between the interconnect members 112. The interconnect members 112 can be arranged generally as a grid or array, and the package 100 can have one or more depopulated areas 116 that do not have interconnect members 112. The one or more depopulated areas 116 can have the at least one electrical component 108, which is not visible in FIG. 3 because it is covered by the mold structure 110.

As discussed above, the package 100 can have a plurality of first interconnect members 112*a*, and one or more second interconnect members 112*b*, which can be larger than the first interconnect members 112*a*. The first interconnect members 112*a* can have a generally circular shape. The second interconnect members 112*b* can be oval-shaped. The second interconnect members 112*b* can have a generally capsular shape, with semicircular ends coupled by a generally rectangular bridge portion. The semicircular ends can have shapes and positions that correspond to where corresponding first interconnect members 112*a* would go in the grid. The end portions (e.g., the semicircular ends) of the second interconnect member 112*b* can have substantially the same radius of curvature as the first or single interconnect members 112*a*. The second (e.g., double) interconnection member 112*b* can have the size and shape of two of the first interconnection members 112*a* that are joined by the bridge portion.

Figure 4:
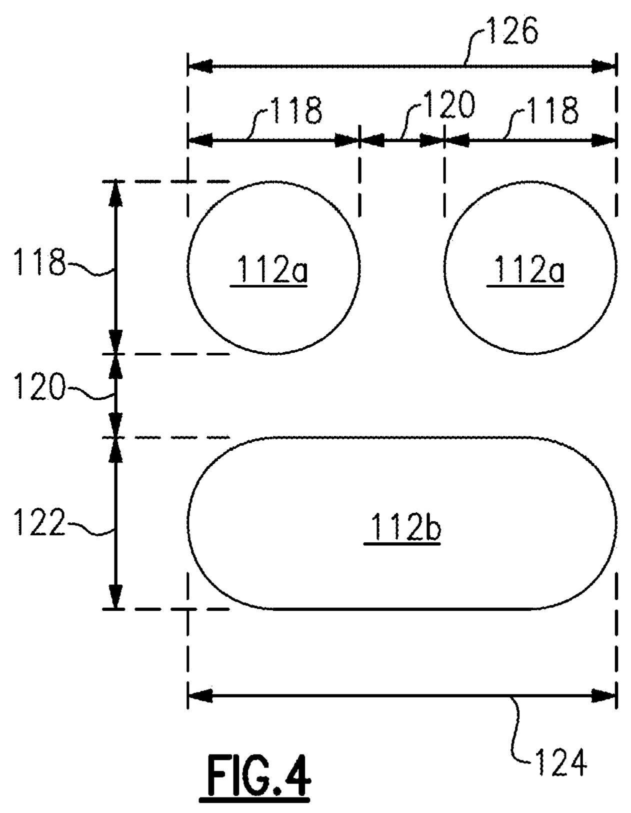
FIG. 4 shows example interconnect members.

FIG. 4 shows one second interconnection member 112*b* and two of the first interconnection members 112*a*. The second interconnection member 112*b* can be a double interconnection member, with the shape of two single interconnection members joined by a bridge portion. The first interconnection members 112*a* can have a width or diameter 118. The first interconnection members 112*a* (e.g., single interconnect members) can have a circular shape, so that the length and width 118 are substantially the same. The first interconnect members 112*a* can have a uniform size (e.g., substantially the same width or diameter 118, such as taken at the widest portion for ball-shaped interconnect members). The first interconnection members 112*a* can be arranged in a grid or array. The first interconnection members 112*a* can be spaced apart by gaps having a width 120. The second interconnection member 112*b* can have an elongated shape with a length 124 that is longer than its width 122. The width 122 of the second interconnection member 112*b* can be substantially the same as the width 118 of the first interconnection members 112*a*. The length 124 of the double interconnection member 112*b* can be substantially the same as the combined length 126 of two of the first interconnection members 112*a* (e.g., that are adjacent each other in the grid or array). The length 124 of the double interconnection member 112*b* can be substantially equal to the distance 126 from a first end of a first single interconnect member 112*a* to a second end of a second single interconnect member 112*a*, where the second end is opposite the first end. The length 124 of the double interconnection member 112*b* can be substantially equal to the width of a first single interconnect member 112*a*, plus the width 120 of a gap between the interconnect members 112*a*, plus the width of a second single interconnect member 112*a*. The one or more second interconnect member(s) 112*b* can be spaced apart from adjacent interconnect members 112*a*, 112*b* by gaps with substantially the same width 120 as the gaps between adjacent single or first interconnect members 112*a*.

Figure 5:
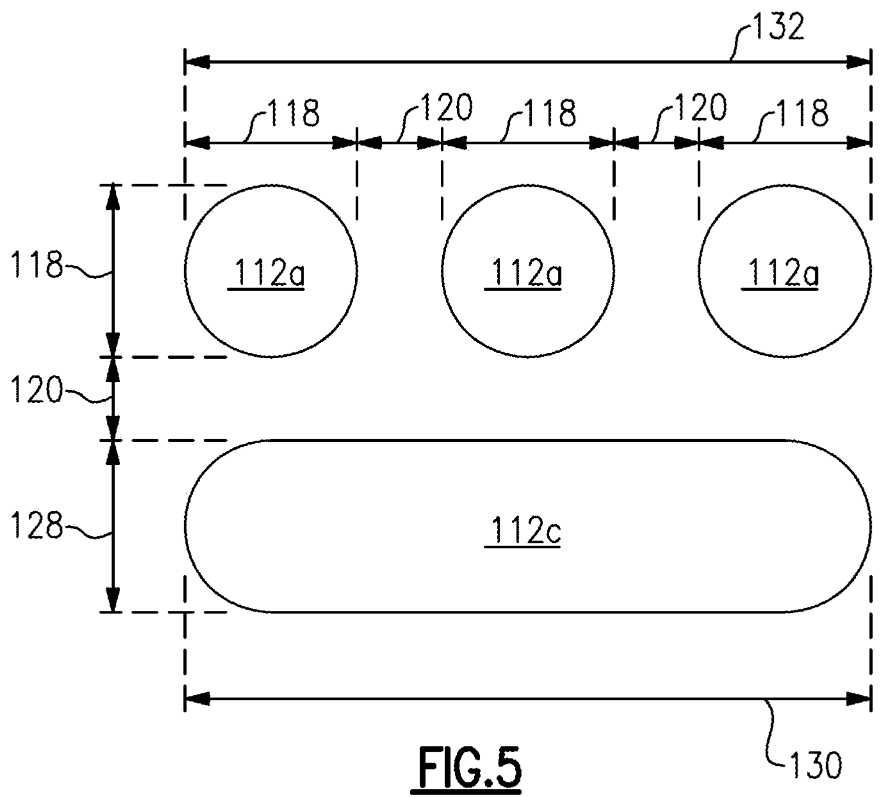
FIG. 5 shows additional example interconnect members.

Various sizes can be used for the elongated interconnect member(s), such as double, triple, quadruple interconnect members, etc. FIG. 5 shows an example of a triple interconnect member 112*c* and three single interconnect members 112*a*. The triple interconnect member 112*c* can have a shape of three single interconnect members arranged linearly and joined by bridge portions. The width 128 of the triple interconnection member 112*c* can be substantially the same as the width 118 of a single interconnection members 112*a*. The length 130 of the triple interconnection member 112*c* can be substantially the same as the combined length 132 of three of the single interconnection members 112*a* (e.g., arranged linearly). The length 130 of the triple interconnection member 112*c* can be substantially equal to the distance 132 from a first end of a first single interconnect member 112*a* to a second end of a third single interconnect member 112*a*, where the second end is opposite the first end, and where a second single interconnect member 112*a* is between the first and third single interconnect members, as shown in FIG. 5. The length 130 of the triple interconnection member 112*c* can be substantially equal to the width of a first single interconnect member 112*a*, plus the width 120 of a first gap between the interconnect members 112*a*, plus the width of a second single interconnect member 112*a*, plus the width 120 of a second gap between the interconnect members 112*a*, plus the width of a third single interconnect member 112*a*. Various longer elongated interconnect members can be used, which can have a length L that is substantially defined by the following equation: $L=n \cdot W+(n-1) \cdot G$, where n is a positive integer, where W is the width of a single interconnect member (and/or of the elongated interconnect member), and where G is the width of a gap between adjacent interconnect members. The length 124 of the second interconnection member 112*b* can be at least 2 times, at least 3 times, at least 4 times, at least 5 times, at least 6 times the width or diameter 118 of the first interconnection members 112*a*, or any values or ranges therebetween.

When the package 100 is subjected to a mechanical shock test, the stress applied to the interconnect members 112 can increase with distance from the center of the package 100. Therefore, the interconnect members 112 at the corners of the package 100 can experience a higher level of stress from a mechanical shock test, and are therefore more likely to fail (e.g., exhibit cracks in the interconnection members 112, between the interconnection members 112 and pads 204, and/or between the interconnection members 112 and pads or other connection points on the substrate 102), as compared to interconnect members 112 closer to the center of the package 100. With reference to FIG. 3, the interconnect members 112 (e.g., solder joints) at the corners would experience greater stress during a mechanical shock test than the interconnect members 112 in a central region of the package. Failure rates of packages, such as the package 100, from mechanical shock tests or other impacts, can be significantly decreased by increasing the mechanical strength of at least some (e.g., some, but not all) of the interconnect members and/or the connections thereto. Accordingly, some embodiments can use the second or elongated interconnect members 112*b* for portions of the package 100 that would experience more stress when dropped. For example, the interconnect members at the corners of the package 100 can use the second or elongated interconnect member 112*b*. In some embodiments, the interconnect member(s) that are furthest from the center of the package 100 can use the second or elongated interconnect member 112*b*. In FIG. 3, a dashed line shows the distance from the center of the package 100 to the interconnect member at the upper right corner of the package. In some embodiments, the connector (s) that are further than a threshold distance from the center of the package 100 can use the second or elongated interconnect member 112*b*. For example, in FIG. 3, an additional double interconnect member 112*b* is used adjacent to the interconnect member 112*b* that is at the corner. Additional elongated interconnect members 112*b* can be used at or near the corner areas of the package 100, such as if a lower threshold distance from the center of the package 100 were used. The substrate 102 can have a generally rectangular shape, in plan view, with four corners, as illustrated. Other suitable shapes can be used, such as other polygonal shapes with corners.

Figure 6:
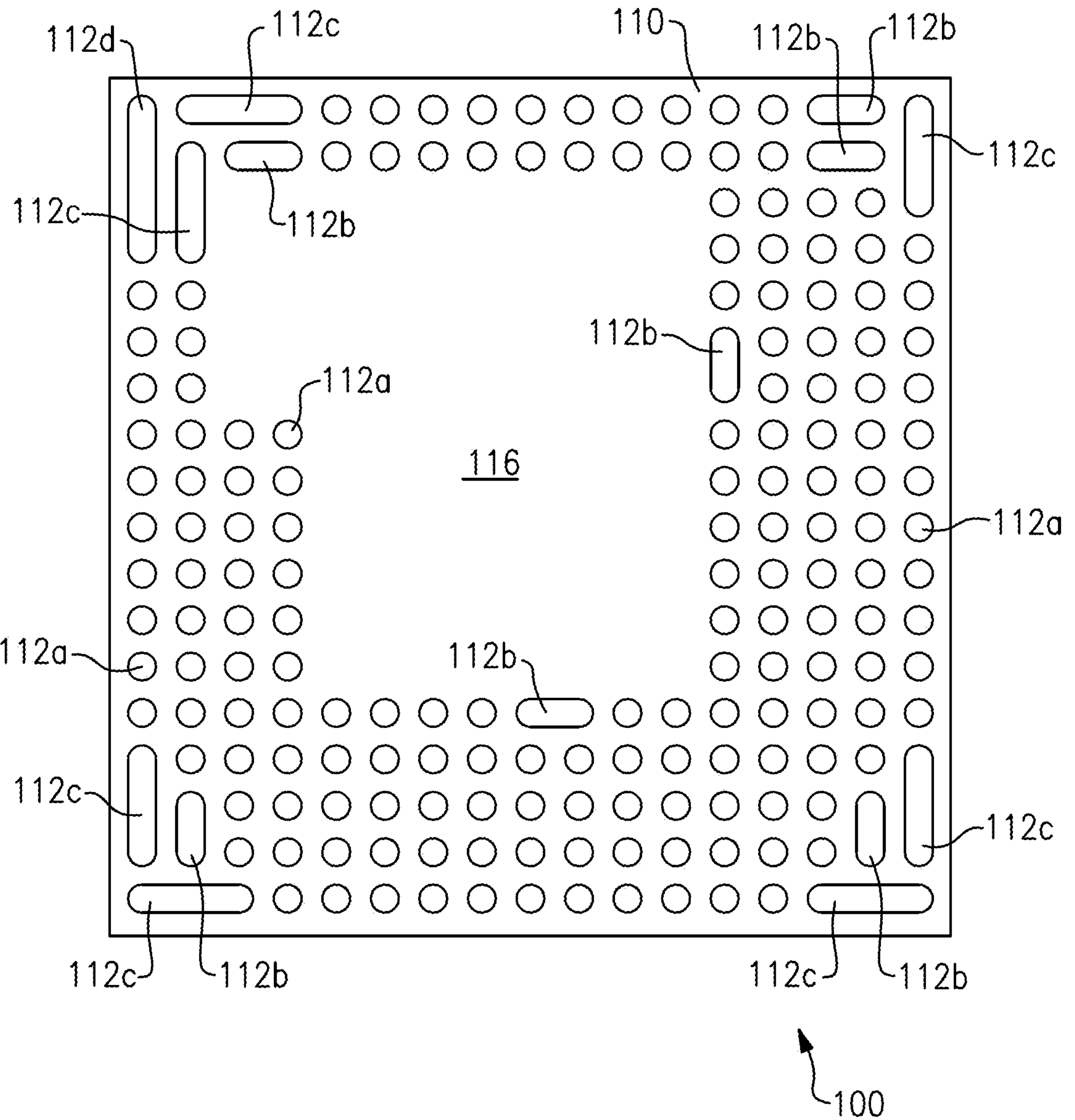
FIG. 6 shows a plan view of a second side of an example of a package.

FIG. 6 shows another example of a second (e.g., bottom) side of a package 100, which can have features similar to the other packages 100 disclosed herein. The package 100 can include a plurality of single interconnect members 112*a*, which can be arranged in a grid or array. The package 100 can include one or more double interconnect members 112*b*. The package 100 can include one or more triple interconnect members 112*b*. The package 100 can include one or more quad interconnect members 112*b*. Longer interconnect members could be used, such as corresponding to the size of 5, 6, 7, 8, or more linearly arranged single interconnect members 112*a*. The embodiment of FIG. 6 can include more elongated interconnect members at the corner regions, as compared to the embodiments of FIG. 5. For example, the embodiments of FIG. 6 may be the resulting of applying a smaller threshold distance from the center of the package 100 for determining where to apply the elongated interconnect members 112*b-d*. In some cases, a larger package size can use more of the elongated interconnect members 112*b-d*, such as reaching further inward from the corner(s).

In some embodiments, the position of the depopulated area(s) 116 can influence the placement or use of the elongated interconnect members 112*b-d*. For example, a depopulated area 116 near a corner can cause that corner to be more susceptible to failure in the event of a drop. Conversely, corner areas without a nearby depopulated area 116 can have more interconnect members 112, which can improve impact energy distribution and reduce the likelihood of breakage at that corner. The elongated interconnect members 112*b-d* (or more of them) can be used at one or more corners or areas on the package near a depopulated area 116. In FIGS. 3 and 6, elongated interconnect members 112*b-d* are used at all four corners. In some embodiments, the elongated interconnect members 112*b-d* can be used at only the upper left corner, which is the corner closest to the depopulated area 116 in FIGS. 3 and 6. In some cases, the elongated interconnect members 112*b-d* can be used at all the corners except the lower right corner in FIGS. 3 and 6, which can be furthest from the depopulated area 116. Various distributions of the elongated interconnect members 112*b-d* can be used, as suitable for various packages 100.

In some embodiments, an elongated interconnect member 112*b* can be used at a location away from the corners of the package 100. For example, in some cases an elongated interconnect member 112*b* can be used for higher power signals, or more current, than the single or circular interconnect members 112*a*. Also, in some cases, elongated interconnect member(s) 112*b* can be used for thermal properties, such as heat dissipation, which can apply at any suitable location on the package 100. The package 100 can have an elongated interconnect member 112*b*, where one or more single or circular interconnect members 112*a* are disposed between the elongated interconnect member 112*b* and the interconnect members at the corners of the package. In the example of FIG. 6, a first inner elongated interconnect member 112*b* is disposed near the bottom of the depopulated area 116, and a second inner elongated interconnect member 112*b* is disposed near the right side of the depopulated area 116. Either or both of those elongated interconnect members 112*b* can be used for transmitting relatively high power signals to or from the package 100, such as to or from the at least one electrical component 108. Alternatively, or additionally, either or both of those elongated interconnect members 112*b* can be used for increasing thermal dissipation (e.g., from at least one electrical component 108, 104*a-d*).

The interconnect members 112 can be arranged as a grid or two-dimensional array, with a plurality of grid locations or cells. The first or single interconnect members 112*a* can each occupy one grid cell or one array location. The second or elongated interconnect members 112*b-d* can each occupy more than one grid cell or array location, such as arranged linearly. For example, a double interconnect member 112*b* can cover two adjacent grid cells or array locations, and a triple interconnect members 112*c* can cover three grid cells or array locations (e.g., arranged along a line), etc.

When multiple array locations are covered by a single interconnect member, those array locations would have a shared signal. In some cases, adjacent grid locations can be associated with different signals (e.g., one for ground and another for input voltage), so that an elongated interconnect member would not be compatible with those adjacent grid locations. In some embodiments, the multiple grid locations associated with an elongated interconnect member 112*b-d* can carry redundant signals (e.g., redundant ground). For example, a first electrical pathway (e.g., through the substrate 102) can couple the first grid location to a contact (e.g., a pin or pad) on an electrical component 104*a-d*, 108 that is configured to receive or output a particular type of signal (e.g., ground, or power input, or a particular control signal). A second electrical pathway (e.g., also through the substrate 102) can couple the second grid location to a contact (e.g., a pin or pad) on an electrical component 104*a-d*, 108 (the same component or a different one) that is configured to receive or output the same particular type of signal (e.g., ground, or power input, or the particular control signal). The elongated interconnect member 112*b-d* can provide the same signal to both of the grid locations. The pads 204 on the circuit board 200 associated with the multiple grid locations covered by the elongated interconnect member 112*b-d* can be configured to provide or receive the same signal (e.g., ground, or power input, or the particular control signal).

Figure 7:
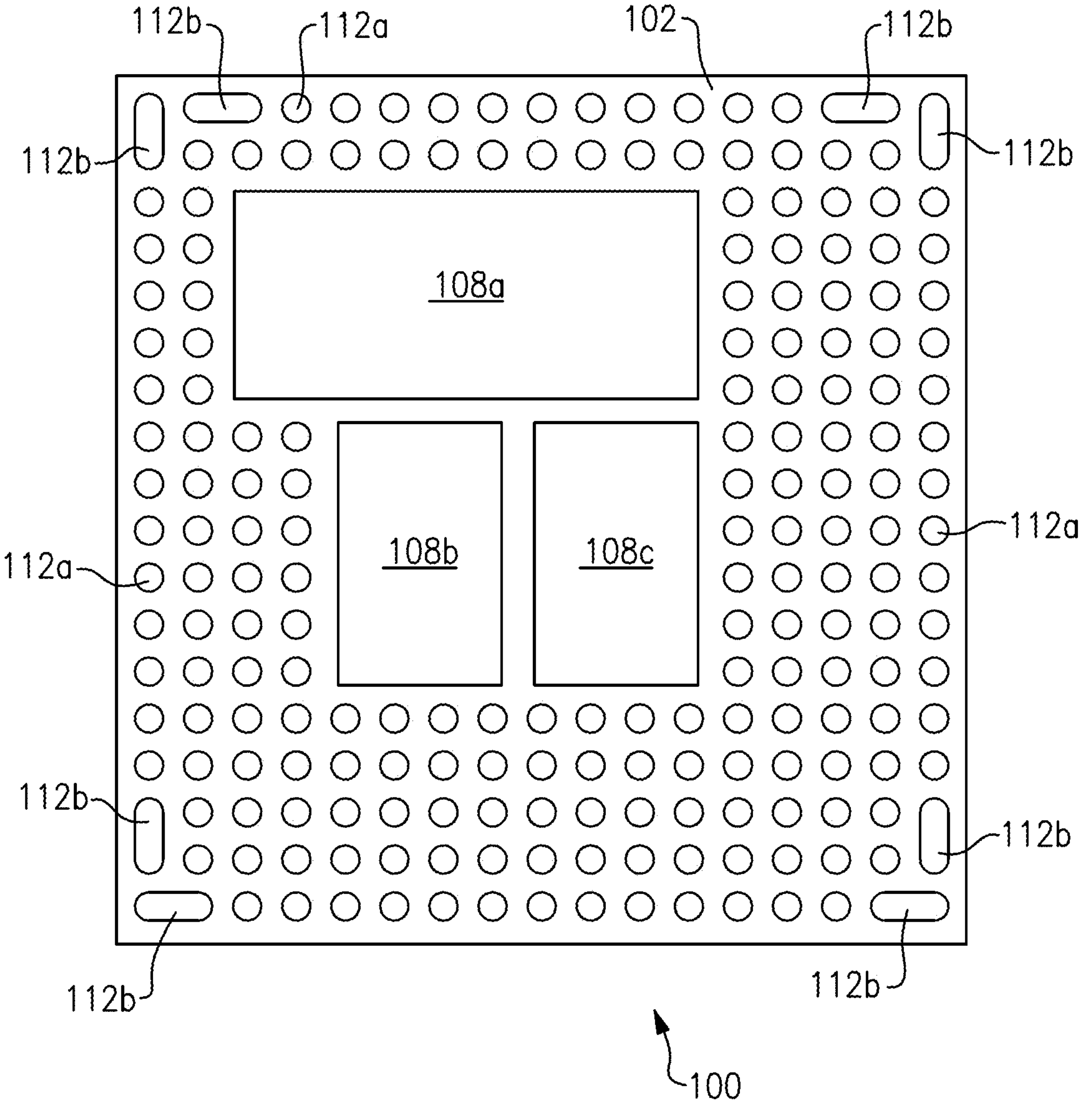
FIG. 7 shows a plan view of a second side of an example of a package.
Figure 8:
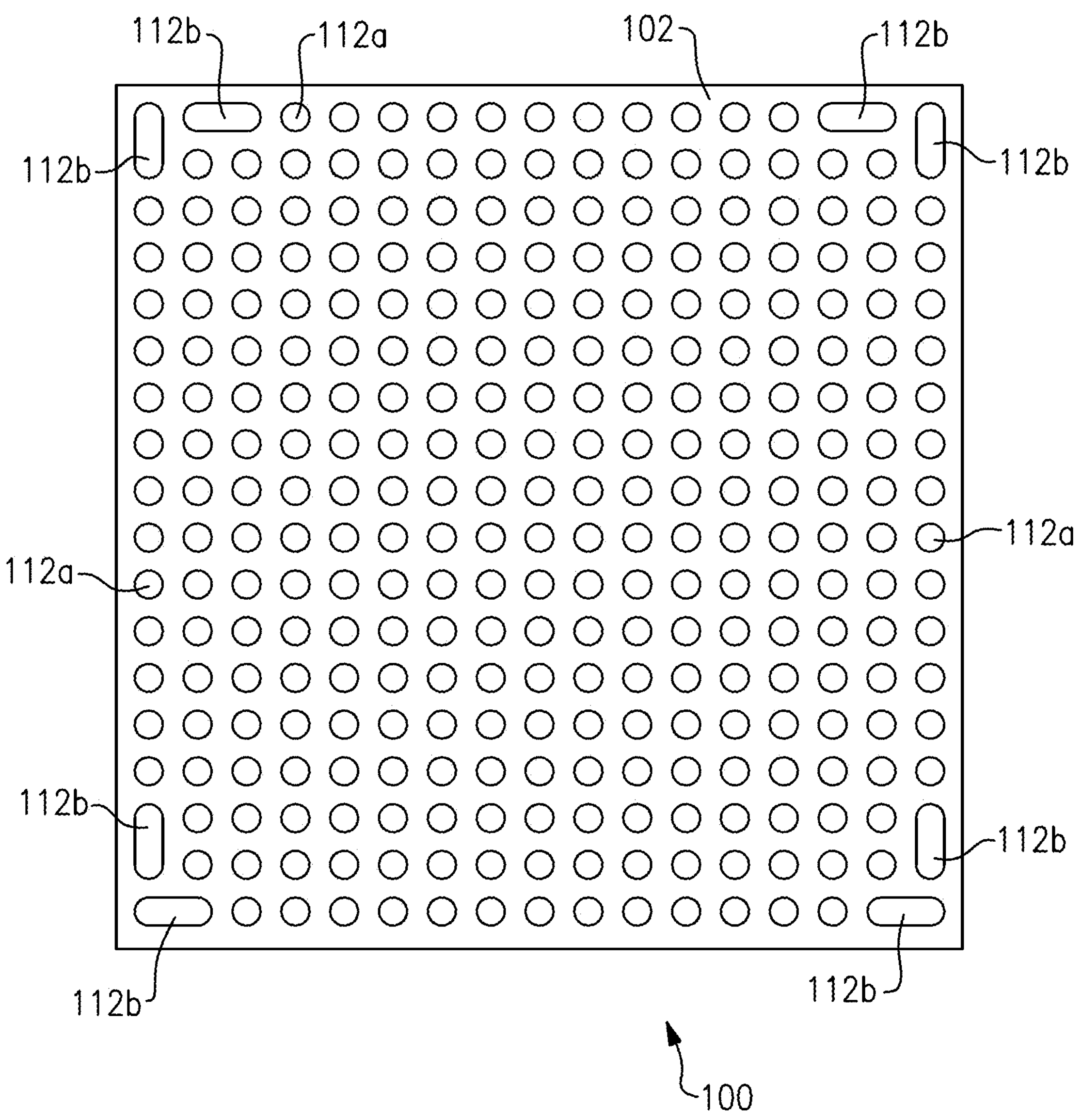
FIG. 8 shows a plan view of a second side of an example of a package.

The elongated interconnect members 112*b-d* can be used with various package types. The package 100 can be a dual-sided molded package, as discussed herein. In some implementations, the package 100 can be a dual-sided ball grid array package. As shown in FIG. 7, in some embodiments, the second mold structure 100 can be omitted. The electrical components 108*a-c* on the second side 102*b* of the substrate 102 can be exposed or can be not covered by a mold material. In some cases, the electrical components 108*a-c* can have caps or shielding (e.g., individually). In some implementations, the package 100 can have a single-sided package, and the electrical component(s) 108 on the second side 102*b* of the substrate 102 can be omitted, as shown for example in FIG. 8.

Figure 9:
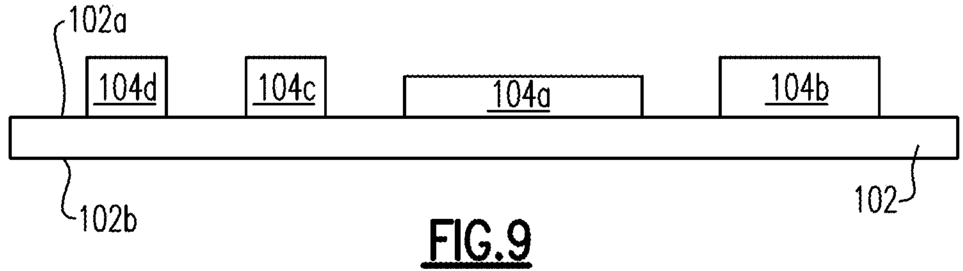
FIGS. 9-14 illustrate fabrication steps of an example method of manufacturing an electrical package.
Figure 10:
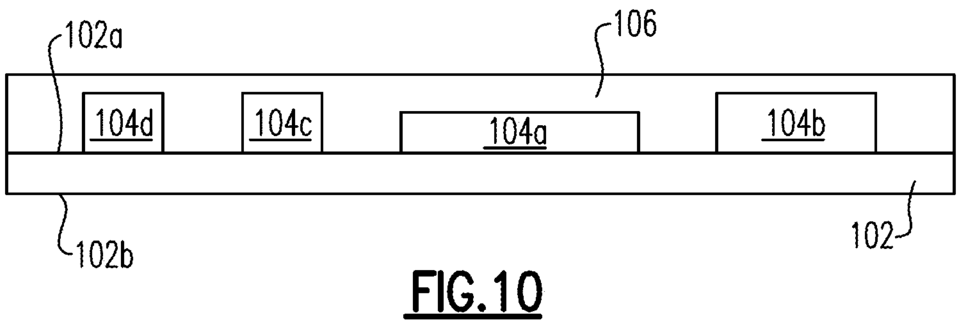

FIGS. 9-14 illustrate example fabrication steps for use in manufacturing a package, such as the package 100. FIG. 9 shows that electrical components 104*a-d* are mounted to the first side 102*a* of the substrate 102. The electrical components 104*a-d* can be mounted by an array of solder joints or other interconnect members (not shown), or by any suitable means of surface mounting technology, such as wire bonding. FIG. 10 shows that the first mold structure 106 can be applied over the first side 102*a* of the substrate 102, such as to encapsulate the electrical components 104*a-d* beneath outer surface of the first mold structure or layer 106. In come embodiments, the steps shown in FIGS. 9 and 10 may be performed after the fabrication steps illustrated in FIGS. 11-14. In some embodiments, the steps of FIGS. 9 and 10 can be performed by a different fabrication process, and a suitable panel can be provided that already includes the electrical components 104*a-d* and the first mold structure 106.

Figure 11:
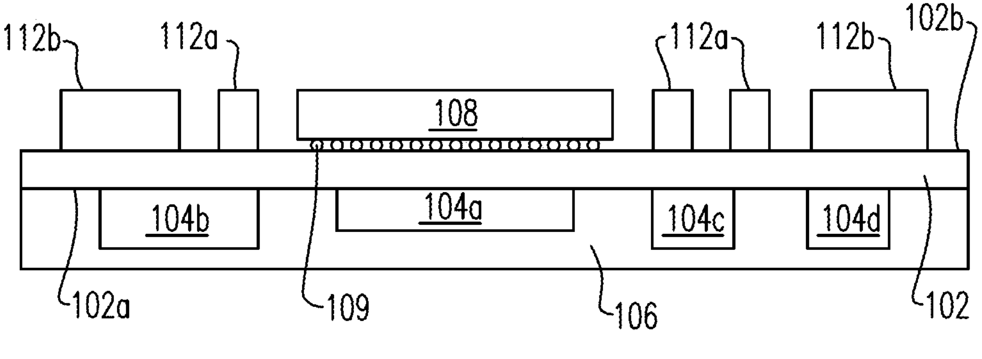

FIG. 11 illustrates that portions of conductive material are formed on the second side 102*b* of the substrate 102 to provide at least a portion of the interconnect members 112. The portions of conductive material can be formed at locations forming a grid or array. The grid or array can have a depopulated area without the portions of the conductive material, such as to provide room for the at least one electrical component 108. Some of the portions of conductive material can be formed at or covering a single grid location (e.g., to form the single or circular interconnect members 112*a*). Some of the portions of conductive material can be formed at or covering multiple grid locations, which can be arranged linearly (e.g., to form the elongated interconnect members 112*b-d*). The portions of the conductive material can be formed as pillars, which can have a generally circular cross-sectional shape for the single interconnect members 112*a*, and which can have a generally capsular cross-sectional shape for the elongated interconnect members 112*b-d*. In some cases, the portions of conductive material can be formed as balls (e.g., solder balls). The portions of the conductive material can be substantially ball-shaped. A single solder ball can be used for the single interconnect members 112*a*. Various suitable solder joint configurations can be used. A solder line, which can be substantially capsule-shaped, can be formed to provide the elongated interconnect members 112*b-d*. The second side 102*b* of the substrate 102 can have pads or other electrical contacts. The portions of conductive material can be formed over or in contact with the pads. The portions of conductive material associated with the single interconnect members 112*a* can be formed over or in contact with a single pad. The portions of conductive material associated with the elongated interconnect members 112*b-d* can be formed over or in contact with a multiple pads (e.g., arranged linearly). In some cases, the pads on the substrate 102 can have different shapes to accommodate the different types of interconnect members 112, with some elongated pads that cover multiple grid locations. Elongated interconnect members 112*b-d* could be formed by printing solder paste onto an elongated substrate pad followed by placing multiple solder balls into the solder paste (e.g., arranged linearly). The multiple solder balls can be reflowed, which can cause the multiple solder balls to combine. After reflow, the solder balls and paste can form an elongated interconnect member 112*b-d*. The elongated interconnect member 112*b-d* can be over-molded and exposed with downstream processes.

FIG. 11 also shows that at least one electrical component 108 is mounted to the second side 102*b* of the substrate 102. The electrical component 108 can be mounted by an array of solder joints or other interconnect members 109, or by any suitable means of surface mounting technology, such as wire bonding. The electrical component 108 can be a flip chip, in some implementations.

Figure 12:
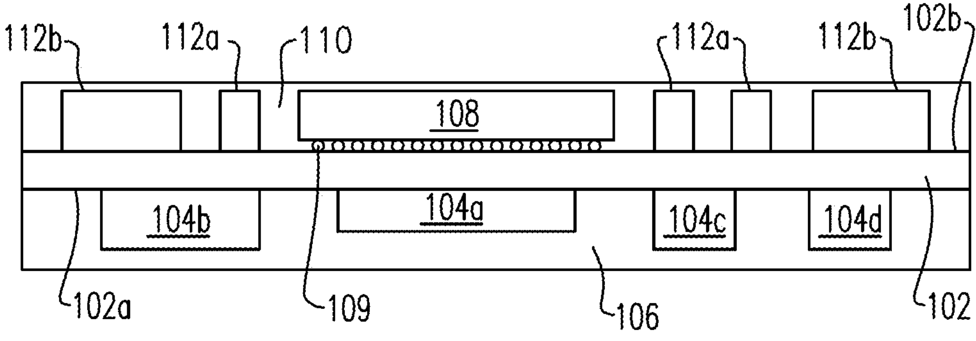

FIG. 12 shows that a second mold structure 110 can be applied over the second side 102*b* of the substrate 102, such as to encapsulate the electrical component(s) 108 beneath outer surface of the second mold structure or layer 110. The portions of the conductive material can be covered by the second mold structure. The second mold material can fill gaps between the portions of the conductive material.

Figure 13:
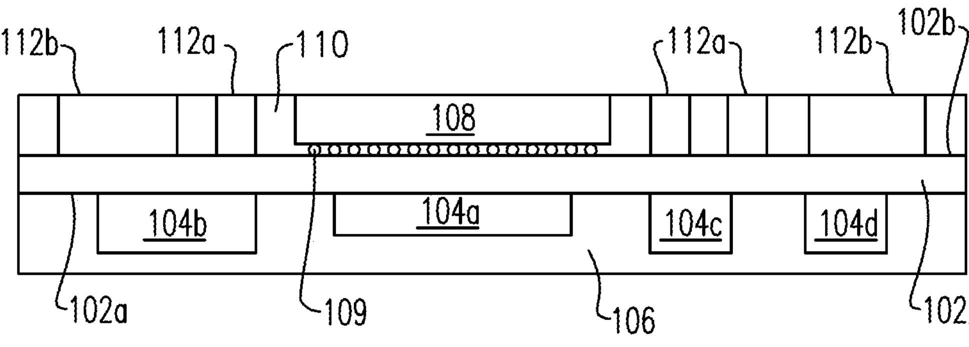

FIG. 13 shows that a portion of the second mold structure 110 can be removed (e.g., by ablation or grinding) to expose the portions of the conductive material. In some cases, grinding can be used to progressively remove a thin layer of the second mold structure 110. In some cases, a thin layer of the portions of the conductive material can be removed by the grinding process. Upon completion of the grinding step, the outer surface of the second mold structure 110 can be substantially flush with the ends of the portions of the conductive material.

Figure 14:
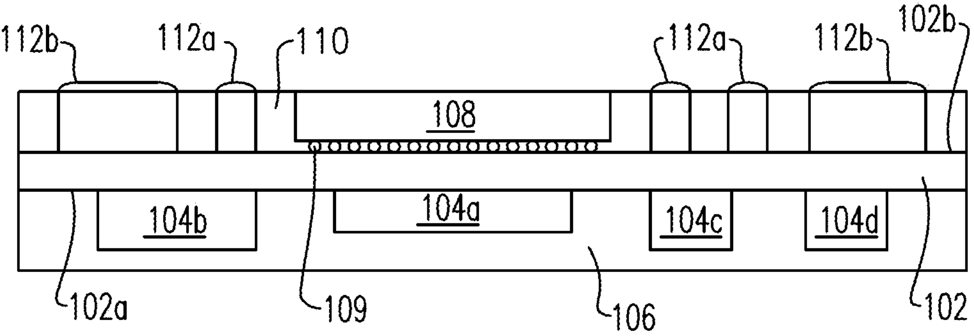

FIG. 14 shows that additional conductive material can be added to the ends of the portions of conductive material to form the interconnect members 112. The additional conductive material can be solder or any other suitable material. The additional conductive material can be the same material as the conductive material formed in FIG. 11 (e.g., solder), or a different conductive material. In some embodiments, the base conductive material formed in FIG. 11 can have a higher melting temperature than the additional conductive material. The additional conductive material (e.g., solder) can have a lower melting temperature than the base conductive material (e.g., copper, nickel, gold, or silver). The additional conductive material can protrude past the outer surface of the second mold structure 110. The additional conductive material may facilitate subsequent coupling of the package to a circuit board. The additional conductive material can be reflowed so that they melt onto pads on the circuit board, for example. In some embodiments, the additional conductive material formed in FIG. 14 can be omitted, and the package of FIG. 13 can be used as the completed package. In some cases, groups of multiple packages can be formed together in a strip or array. Individual packages can be separated, such as after fabrication.

Many variations are possible. In some embodiments, additional conductive material is not added at FIG. 14, but the previously formed conductive material can be reflowed to reshape the conductive material to form the interconnect members 112. In some implementations, the reflow can reshape the conductive material so that a portion protrudes past the outer surface of the second mold structure 110. In some implementations, the reflow can form a gap between the interconnect member 112 and the second mold structure 110. The grinding or other removal process can remove a portion of the conductive material (e.g., solder joint) so that it is no longer generally spherical, and the reflow can reshape the conductive material into a new, smaller generally spherical shape, which can provide the gap between the conductive material and the second mold structure 110.

Figure 15:
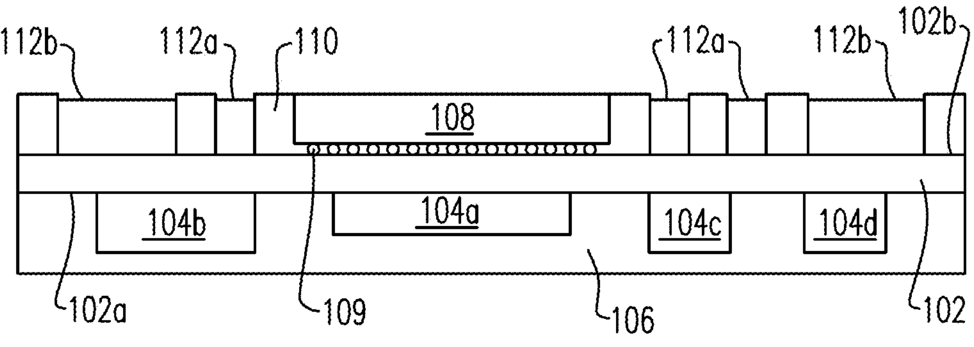
FIGS. 15-17 illustrate additional or alternative fabrication steps for methods of manufacturing of an electrical package.

In some embodiments, the grinding step of FIG. 13 can be omitted. FIG. 15 shows that a portion of the second mold structure 110 can be removed (e.g., by laser ablation) to form wells in the second mold structure 110 at the location of each of the interconnect members 112. The conductive material can be exposed by and recessed within the wells, e.g., so that end faces are visible when looking into the wells. Laser ablation or a similar process may be employed to locally remove material of the second mold structure 110 to form each well and thereby expose the conductive material. The device of FIG. 15 can be used as the completed package in some embodiments.

Figure 16:
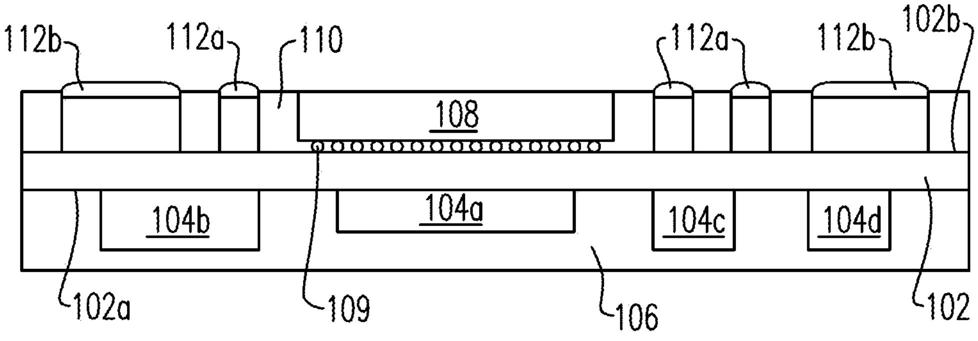

FIG. 16 shows that additional conductive material can be added to the ends of the portions of conductive material to form the interconnect members 112. The additional conductive material can be solder or any other suitable material. The additional conductive material can be the same material as the conductive material formed in FIG. 11 (e.g., solder), or a different conductive material. In some embodiments, the base conductive material formed in FIG. 11 can have a higher melting temperature than the additional conductive material. The additional conductive material (e.g., solder) can have a lower melting temperature than the base conductive material (e.g., copper, nickel, gold, or silver). The additional conductive material can protrude past the outer surface of the second mold structure 110. In some cases, the additional conductive material can be substantially flush with the outer surface of the second mold structure 110. The additional conductive material may facilitate subsequent coupling of the package to a circuit board. The additional conductive material can be reflowed so that they melt onto pads on the circuit board, for example.

Figure 17:
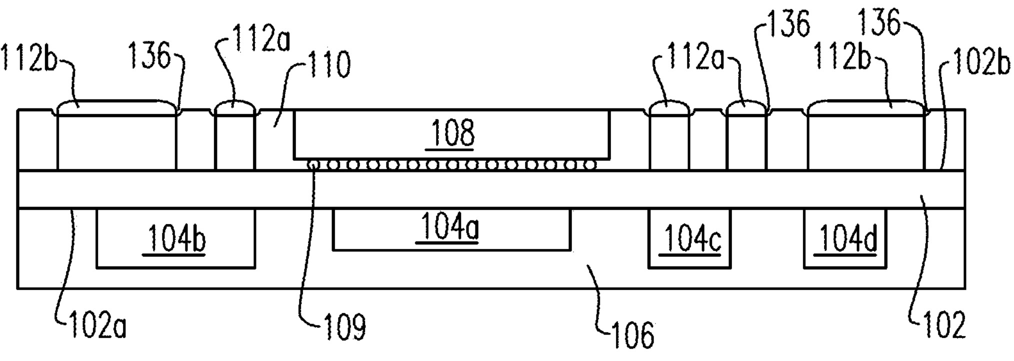

With reference to FIG. 17, in some embodiments, laser ablation or a similar process can be performed to locally remove mold material in the vicinity of each of the array of interconnect members 112 (e.g., solder joints), to define a moat or channel 136 circumscribing each of the interconnect members 112. The laser ablation step of FIG. 15 can remove mold material laterally past the ends of the conductive material to form the moats or channels 136, in some cases. In some implementations, laser ablating can be performed to form the moats or channels 136 after the additional conductive material is formed in FIG. 16. In some embodiments, the moats or channels 136 can be omitted.

Figure 18:
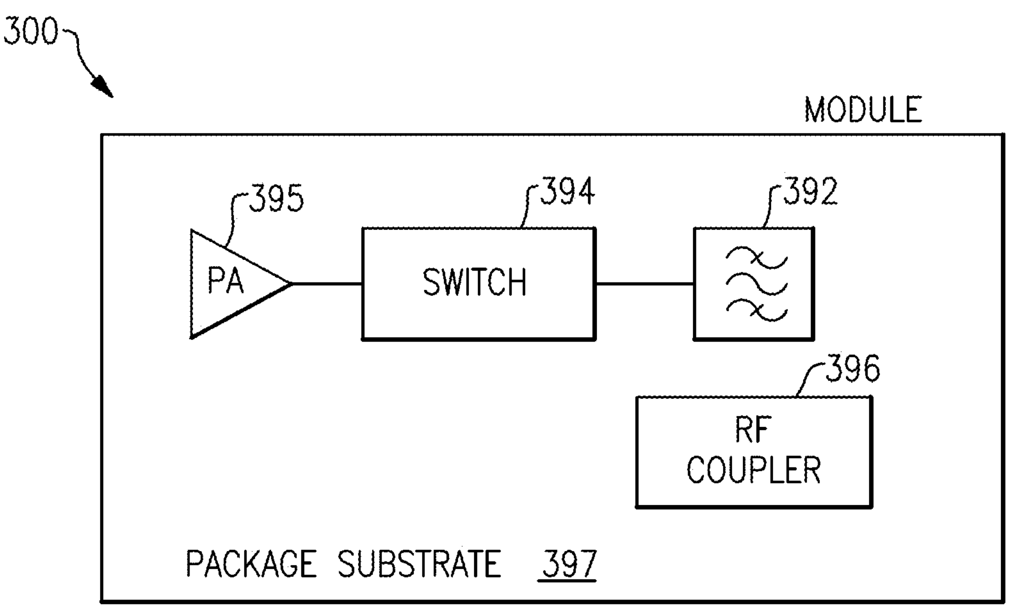
FIG. 18 is a schematic block diagram of a packaged module that includes a filter.

FIG. 18 is a schematic block diagram of a module 300 that includes a filter 392, which can have an acoustic wave device. The module 300 includes the filter 392 that includes an acoustic wave device, a switch 394, a power amplifier 395, and a radio frequency (RF) coupler 396. The power amplifier 395 can amplify a radio frequency signal. The switch 394 can selectively electrically couple an output of the power amplifier 395 to the filter 392. The filter 392 can be a band pass filter. The filter 392 can be included in a duplexer or other multiplexer. The RF coupler 396 can be a directional coupler or any other suitable RF coupler. The RF coupler 396 can sample a portion of RF power in a transmit signal path and provide an indication of the RF power. The RF coupler 396 can be coupled to the transmit signal path in any suitable point, such as between an output of the power amplifier 395 and an input to the switch 394. The module 300 can include a package that encloses the illustrated elements, for example as disclosed in connection with various embodiments discussed herein. The filter 392 with the acoustic wave resonator can be disposed on a common packaging substrate 397 with the other illustrated elements of the module 300. The packaging substrate 397 can be a laminate substrate, for example.

Figure 19:
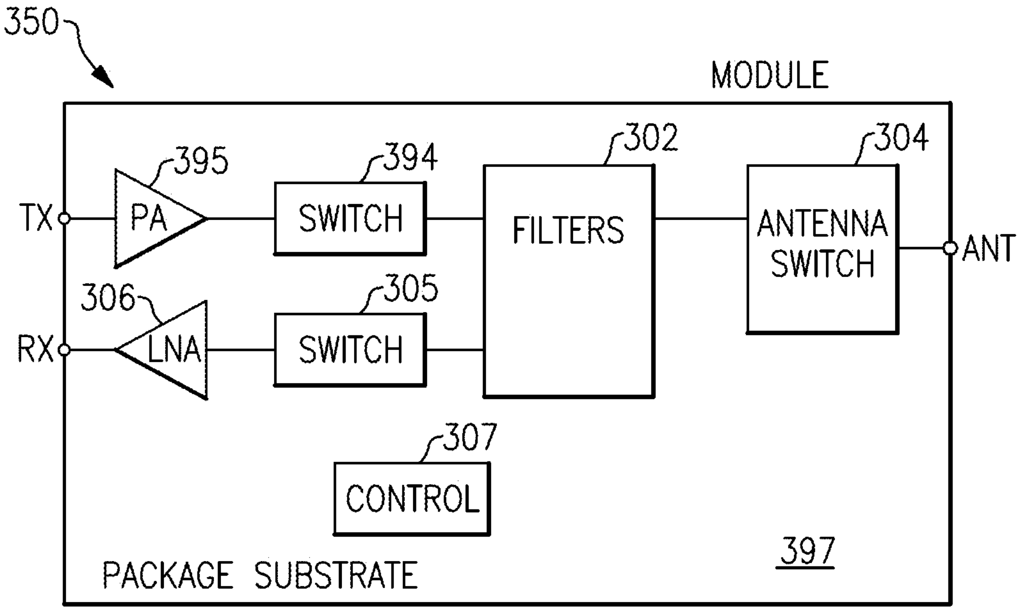
FIG. 19 is a schematic block diagram of a packaged module that includes a filter.

FIG. 19 is a schematic block diagram of a module 350 that includes filters 302 that include one or more acoustic wave devices. As illustrated, the module 350 includes a power amplifier 395, a switch 394, filters 302, an antenna switch 304, a switch 305, a low noise amplifier 306, and a control circuit 307.

The power amplifier 395 can receive a radio frequency signal from a transmit port TX. In some instances, a switch can electrically connect a selected one of a plurality of transmit ports to an input of the power amplifier 395. The power amplifier 395 can operate in an envelope tracking mode and/or an average power tracking mode. The switch 394 can be a multi-throw radio frequency switch configured to electrically connect an output of the power amplifier 395 to one or more selected transmit filters of the filters 302. The switch 394 can be a band select switch arranged to electrically connect the output of the power amplifier 395 to a transmit filter for a particular frequency band.

The filters 302 can be acoustic wave filters. One or more resonators in any of the filters 302 can include a multi-layer IDT electrode. In certain applications, all acoustic resonators of one or more filters of the filters 302 include a multi-layer IDT electrode. The filters 302 can include a plurality of duplexers and/or other multiplexers. Alternatively or additionally, the filters 302 can include one or more standalone transmit filters and/or one or more standalone receive filters. The filters 302 can include at least four duplexers in some applications. According to some other applications, the filters 302 can include at least eight duplexers.

As illustrated, the filters 302 are electrically connected to the antenna switch 304. The antenna switch 304 can be a multi-throw radio frequency switch arranged to electrically connect one or more filters of the filters 302 to an antenna port ANT of the module 350. The antenna switch 304 can include at least eight throws in some applications. In certain applications, the antenna switch 304 can include at least ten throws.

A switch 305 can electrically connect a selected receive filter of the filters to a low noise amplifier 306. The low noise amplifier 106 is arranged to amplify the received radio frequency signal and provide an output to a receive port RX. In some instances, another switch can be electrically coupled between the low noise amplifier 306 and the receive port RX.

The illustrated module 350 also includes a control circuit 307. The control circuit 307 can perform any suitable control functions for the module 350. The module 350 can include a package that encloses the illustrated elements, for example as disclosed in connection with various embodiments discussed herein.

Figure 20A:
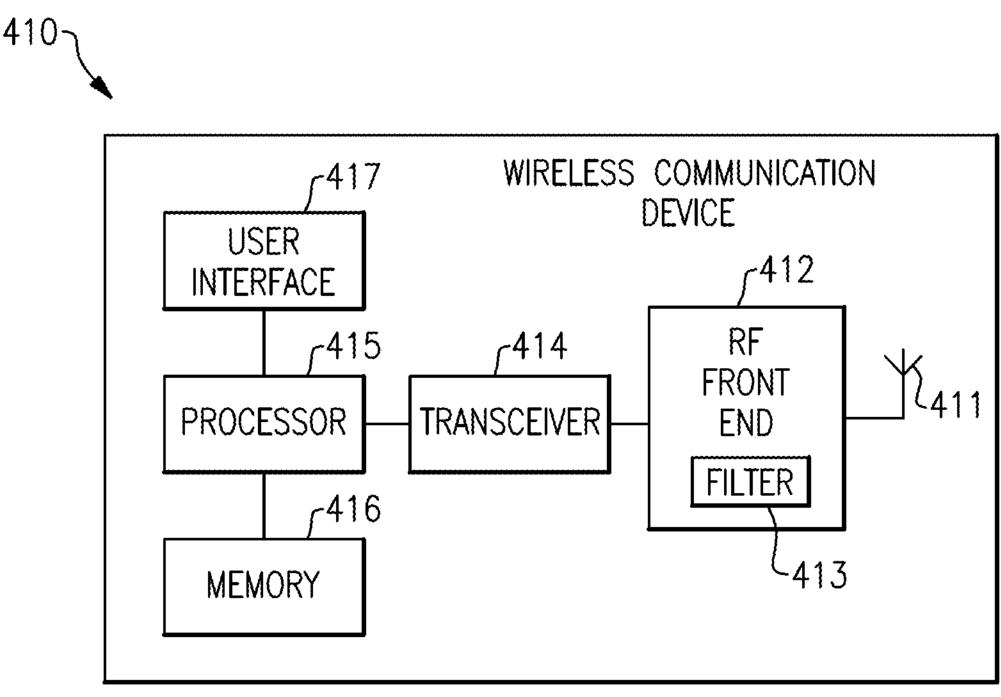
FIG. 20A is a schematic block diagram of a wireless communication device that includes a filter.

FIG. 20A is a schematic block diagram of a wireless communication device 410 that includes a filter 413 with an acoustic wave device. The wireless communication device 410 can be any suitable wireless communication device. For instance, a wireless communication device 410 can be a mobile phone, such as a smart phone. As illustrated, the wireless communication device 410 includes an antenna 411, an RF front end 412, an RF transceiver 414, a processor 415, a memory 416, and a user interface 417. The antenna 411 can transmit RF signals provided by the RF front end 412. The antenna 411 can provide received RF signals to the RF front end 412 for processing.

The RF front end 412 can include one or more power amplifiers, one or more low noise amplifiers, one or more RF switches, one or more receive filters, one or more transmit filters, one or more duplex filters, one or more filters of a multiplexer, one or more filters of a diplexer or other frequency multiplexing circuit, or any suitable combination thereof. The RF front end 412 can transmit and receive RF signals associated with any suitable communication standard.

The RF transceiver 414 can provide RF signals to the RF front end 412 for amplification and/or other processing. The RF transceiver 414 can also process an RF signal provided by a low noise amplifier of the RF front end 412. The RF transceiver 414 is in communication with the processor 415. The processor 415 can be a baseband processor. The processor 415 can provide any suitable base band processing functions for the wireless communication device 410. The memory 416 can be accessed by the processor 415. The memory 416 can store any suitable data for the wireless communication device 410. The processor 415 is also in communication with the user interface 417. The user interface 417 can be any suitable user interface, such as a display.

Figure 20B:
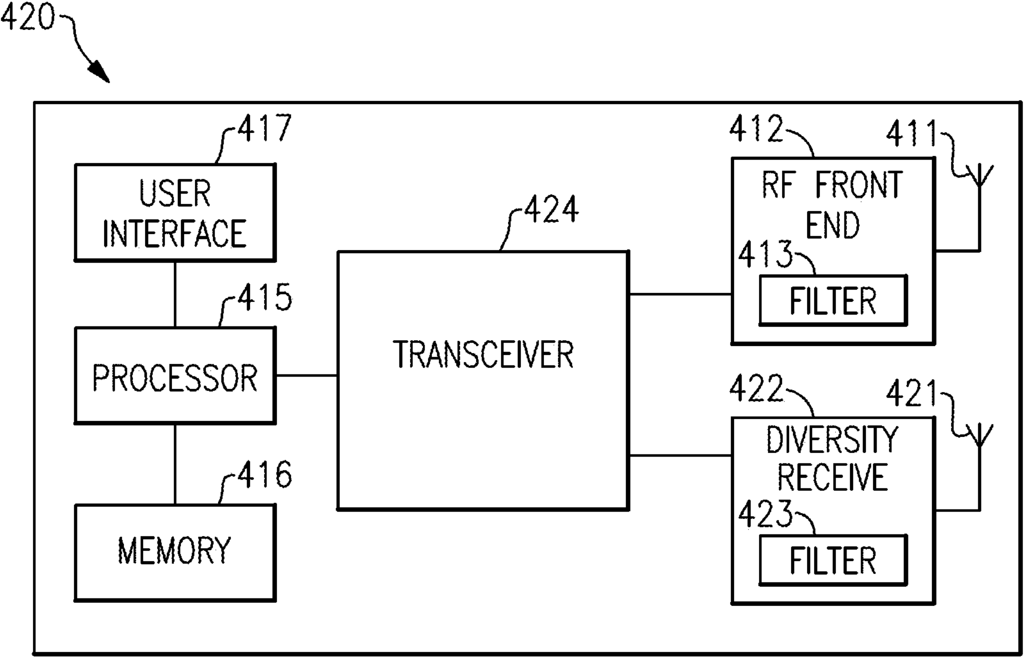
FIG. 20B is a schematic block diagram of a wireless communication device that includes a filter.

FIG. 20B is a schematic block diagram of a wireless communication device 420 that includes a radio frequency front end 412 with a filter 413 and a diversity receive module 422 with a filter 423 according to an embodiment. The wireless communication device 420 is like the wireless communication device 410 of FIG. 12A, except that the wireless communication device 420 also includes diversity receive features. As illustrated in FIG. 20B, the wireless communication device 420 includes a diversity antenna 421, a diversity module 422 configured to process signals received by the diversity antenna 421 and including filters 423, and a transceiver 424 in communication with both the radio frequency front end 422 and the diversity receive module 422. The filter 423 can include one or more acoustic wave resonators having any suitable interdigital transducer (IDT) electrode. The filter 423 can include one or more acoustic wave resonators having any suitable IDT electrode. The wireless communication devices 410 and 420 can include packages according to various embodiments disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 gigahertz (GHz), such as in a frequency range from about 450 MHz to 8.5 GHz. An acoustic wave resonator can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators. FR1 can be from 410 MHz to 7.125 GHz, for example, as specified in a current 5G NR specification. One or more acoustic wave resonators can be included in a filter arranged to filter a radio frequency signal in a fourth generation (4G) Long Term Evolution (LTE) operating band.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

The following is claimed:

1. An electrical package comprising:

a substrate having a first side and a second side opposite the first side;

one or more electrical components mounted to the substrate; and a plurality of electrically conductive interconnect members coupled to the second side of the substrate, including at least one of the interconnect members that has an elongated shape with a length that is longer than a width, the interconnect members are arranged as a grid, with a group of the interconnect members each occupying a single grid cell, and the at least one of the interconnect members with the elongated shape occupying at least two grid cells arranged linearly, and the at least two grid cells communicating a signal.

2. The electrical package of claim 1 wherein the one or more electrical components are mounted to the first side of the substrate, and having one or more additional electrical components mounted to the second side of the substrate.

3. The electrical package of claim 2 further comprising a mold structure extending over at least part of the second side of the substrate and at least partially surrounding the one or more additional electrical components.

4. The electrical package of claim 3 further comprising a mold structure extending over at least part of the first side of the substrate and at least partially surrounding the one or more electrical components.

5. The electrical package of claim 1 wherein the substrate has a generally rectangular shape in plan view with four corners, with the interconnect member with the elongated shape positioned at or proximate one of the corners.

6. The electrical package of claim 5 wherein others of the interconnect members have a generally circular shape in plan view and are disposed inward from the one of the corners.

7. The electrical package of claim 1 wherein the substrate has a corner, and the closest interconnect member to the corner has the elongated shape.

8. The electrical package of claim 1 wherein a plurality of the interconnect members have a generally circular shape in plan view with a substantially uniform diameter, the at least one of the interconnect members with the elongated shape having a width that is substantially equal to the diameter of the circular interconnect members and a length that is at least two times the diameter of the circular interconnect members.

9. The electrical package of claim 1 wherein the interconnect member with the elongated shape is a furthest interconnection member from a center of the package.

10. The electrical package of claim 1 wherein the at least one interconnect member with the elongated shape has a length L that is substantially equal to $n \cdot W + (n-1) \cdot G$, where n is a positive integer, W is a width of the interconnect member, and G is a distance between adjacent interconnect members.

11. The electrical package of claim 1 wherein the package is a dual-sided molded package.

12. An electrical package comprising:

a substrate having a first side and a second side opposite the first side;

one or more electrical components mounted to the substrate;

a plurality of first electrically conductive interconnect members coupled to the second side of the substrate and having substantially uniform widths; and at least one second electrically conductive interconnect member having a width that is substantially the same as the substantially uniform widths of the first interconnect members and a length that is greater than or equal to a combined length of two of the first interconnect members, the interconnect members are arranged as a grid, with the first interconnect members each occupying a single grid cell, and the at least one second interconnect member occupying at least two grid cells, and the at least two grid cells communicating a signal.

13. The electrical package of claim 12 wherein the one or more electrical components are mounted to the first side of the substrate, and having one or more additional electrical components mounted to the second side of the substrate.

14. The electrical package of claim 13 further comprising a mold structure extending over at least part of the second side of the substrate and at least partially surrounding the one or more additional electrical components.

15. The electrical package of claim 14 further comprising a mold structure extending over at least part of the first side of the substrate and at least partially surrounding the one or more electrical components.

16. The electrical package of claim 12 wherein the substrate has a generally rectangular shape in plan view with four corners, with the at least one second interconnect member positioned at or proximate to at least one of the corners.

17. The electrical package of claim 12 wherein the first interconnect members have a generally circular shape in plan view.

18. The electrical package of claim 12 wherein the second interconnect member is a furthest interconnection member from a center of the package.

19. The electrical package of claim 12 wherein the at least one second interconnect member has a length L that is substantially equal to $n \cdot W + (n-1) \cdot G$, where n is a positive integer, W is the width of the first interconnect members, and G is a distance between adjacent first interconnect members.

20. The electrical package of claim 12 wherein the second interconnect member has a shape of two of the first interconnect members coupled by a bridge portion.

21. The electrical package of claim 12 wherein the second interconnect member has a generally capsular shape.

22. The electrical package of claim 12 wherein the package is a dual-sided molded package.

23. The electrical package of claim 1 wherein the at least two grid cells communicate a shared signal.

24. The electrical package of claim 1 wherein each grid cell of the at least two grid cells communicates a different signal.

* * * * *